United States Patent [19]
Scheurich

[11] Patent Number: 5,934,540
[45] Date of Patent: Aug. 10, 1999

[54] HORIZONTAL SOLDERING SYSTEM WITH OIL BLANKET

[75] Inventor: Nicholas J. Scheurich, Merrimack, N.H.

[73] Assignee: Teledyne Industries, Inc., Los Angeles, Calif.

[21] Appl. No.: 08/903,905

[22] Filed: Jul. 31, 1997

[51] Int. Cl.⁶ .............................. B23K 1/08; B23K 1/00; B23K 37/04
[52] U.S. Cl. .......................... 228/37; 228/20.1; 228/34; 228/36; 228/43; 228/49.5; 228/259; 228/260
[58] Field of Search ........................... 228/259, 37, 20.1, 228/180.1, 42, 49.5, 180.21, 36, 34, 256, 39, 219, 43

[56] References Cited

U.S. PATENT DOCUMENTS

| | | | |
|---|---|---|---|
| 4,530,457 | 7/1985 | Down | 228/180.2 |
| 4,608,941 | 9/1986 | Morrris | 118/63 |
| 4,903,631 | 2/1990 | Morris | 118/63 |
| 5,007,369 | 4/1991 | Morris | 118/56 |
| 5,209,782 | 5/1993 | Morris | 118/603 |
| 5,226,924 | 7/1993 | Meuche | 118/424 |

*Primary Examiner*—Patrick Ryan
*Assistant Examiner*—Kiley Stoner
*Attorney, Agent, or Firm*—Hayes, Soloway, Hennessey, Grossman & Hage, P.C.

[57] ABSTRACT

A solder immersion chamber in a solder crater/leveler includes a solder manifold having upper and lower solder chambers, from which solder is directed onto the top and bottom surfaces of printed circuit boards conveyed therebetween. The solder immersion chamber has a pair of driven rollers at either end thereof for conveying the printed circuit boards through the solder immersion chamber, and for damming and holding the molten solder within the solder immersion chamber. A pair of oil weirs is provided adjacent either side of the upper solder chamber for continuously flowing oil to flood the top surface of the molten solder in the solder immersion chamber. A skimmer skims oil from the top surface of the molten solder, and returns the separated oil to the pair of oil weirs.

18 Claims, 6 Drawing Sheets

HORIZONTAL SOLDERING SYSTEM WITH OIL BLANKET

FIELD OF THE INVENTION

The present invention relates to soldering systems, and more particularly, to an improved system for solder coating both sides of printed circuit boards.

BACKGROUND OF THE INVENTION

Printed circuit boards widely used in electronics and electrical devices are formed with major dimensions of length and width and contain one or more circuits. The thickness of the printed circuit boards varies for many different reasons and directly affects panel flexibility, i.e. there are rigid and flexible circuit boards.

For example, printed circuit boards with multiple conductor planes use a bonded dielectric layer or layers for separation. Holes perforated through the circuit substrate serve a number of purposes including solder terminals for installation into another assembly, plated through hole interconnections between conductor planes and tooling registration holes.

Exposed copper on the finished printed circuit boards must, with few exceptions, be solder coated, a process sometimes termed presoldering or tinning. It is preferable that the solder coating be applied only where needed later and not on all conductor runs. To apply solder selectively, a dielectric, referred to as a cover dielectric or solder mask, is used to cover copper, the normally used conductor, that need not be solder coated. Thus desired copper portions remain exposed and are solder coated, including terminal pads and the like. In other words, the exposed copper on the surface or surfaces of the printed circuit board must be effectively solder coated.

It is also necessary that all holes through the printed circuit board be lined with solder but unobstructed by solder when finished, so as not to obstruct later component lead insertion requirements. The process of removing excess surface solder and clearing the holes of solder, after solder coating the surface conductors, is referred to as solder leveling or leveling.

In other words, printed circuit boards are soldered, inter alia, to maintain solderability for subsequent operations. For economic purposes, such soldering should be accomplished as a mass board coating technique and should provide even coatings on the surfaces and in holes without surface flaws.

BRIEF DISCUSSION OF THE PRIOR ART

An apparatus for soldering printed circuit boards, disclosed in U.S. Pat. No. 4,608,941, assigned to the common assignee, includes a roll configuration to convey the panels horizontally across a solder immersion station containing a flow of molten solder. Immersion of the printed circuit boards in flowing solder is followed by subjecting the boards to suitably positioned air knives for leveling the solder on the panels.

The improvement in the apparatus of U.S. Pat. No. 4,608,941 is disclosed in U.S. Pat. No. 4,903,631, also assigned to the common assignee, according to which the solder immersion station is defined by upper and lower retainer guide means and two pairs of rollers. Each roll paid includes an upper roller and a lower roller, the rollers functioning to convey printed circuit boards horizontally through the chamber. The guide means are parallel to the rollers and the lower guide means is positioned close to the lower rolls to minimize solder leakage. The solder immersion stations also includes means adjacent the ends of the pairs of rollers for further enclosing the solder chamber. An opening is provided in the lower guide means parallel to the rollers for communication with a manifold positioned parallel to end below the solder chamber. Means are provided for pumping solder into the manifold to flood the solder chamber through the opening. Vertical manifolds close the ends of the immersion chamber and provide an additional vertical flow path to carry solder up and around printed circuit boards passing through the camber to ensure a full solder chamber. The lower guide includes lips positioned closely to the surface of the lower rolls to prevent excess leakage of solder from the chamber before and as the rollers convey the printed circuit boards through the molten solder.

See, also, U.S. Pat. No. 5,007,369, also assigned to the common assignee, which provides a further improvement in solder coating stations, in which the level of the molten solder in the supply and overflow collection vessels is maintained at a level below the horizontal roller nip. According to U.S. Pat. No. 5,007,369, since the workpiece moves in a horizontal plane, under the influence of multiple opposing upper and lower drive rollers, together with the transverse liquid solder flow channeling, excess solder overflow which may lead to dross formation is minimized.

SUMMARY OF THE INVENTION

The present invention provides a further improvement in a soldering apparatus of the type disclosed in U.S. Pat. Nos. 4,608,941, 4,903,631 and 5,007,369. More particularly, the present invention provides an improvement in solder manifolds of the type disclosed in our aforesaid U.S. Pat. Nos. 4,608,941, 4,903,631 and 5,007,369, and other solder coater levelers, by providing of a novel solder immersion chamber in which the exposed surface of the solder in the solder coating chamber is maintained under a constantly replenished oil blanket. The solder immersion chamber of the present invention also provides means for directing a high velocity stream of molten solder in a controlled manner so as to maximize displacement of flux from the printed circuit boards so as to provide improved soldering.

BRIEF DESCRIPTION OF THE DRAWINGS

Further features and advantages of the present invention will become apparent from the following detailed description, taken in connection with the accompanying drawings in which like numerals depict like parts, and wherein.

DETAILED DESCRIPTION OF EXEMPLARY EMBODIMENT

Figure 1A:
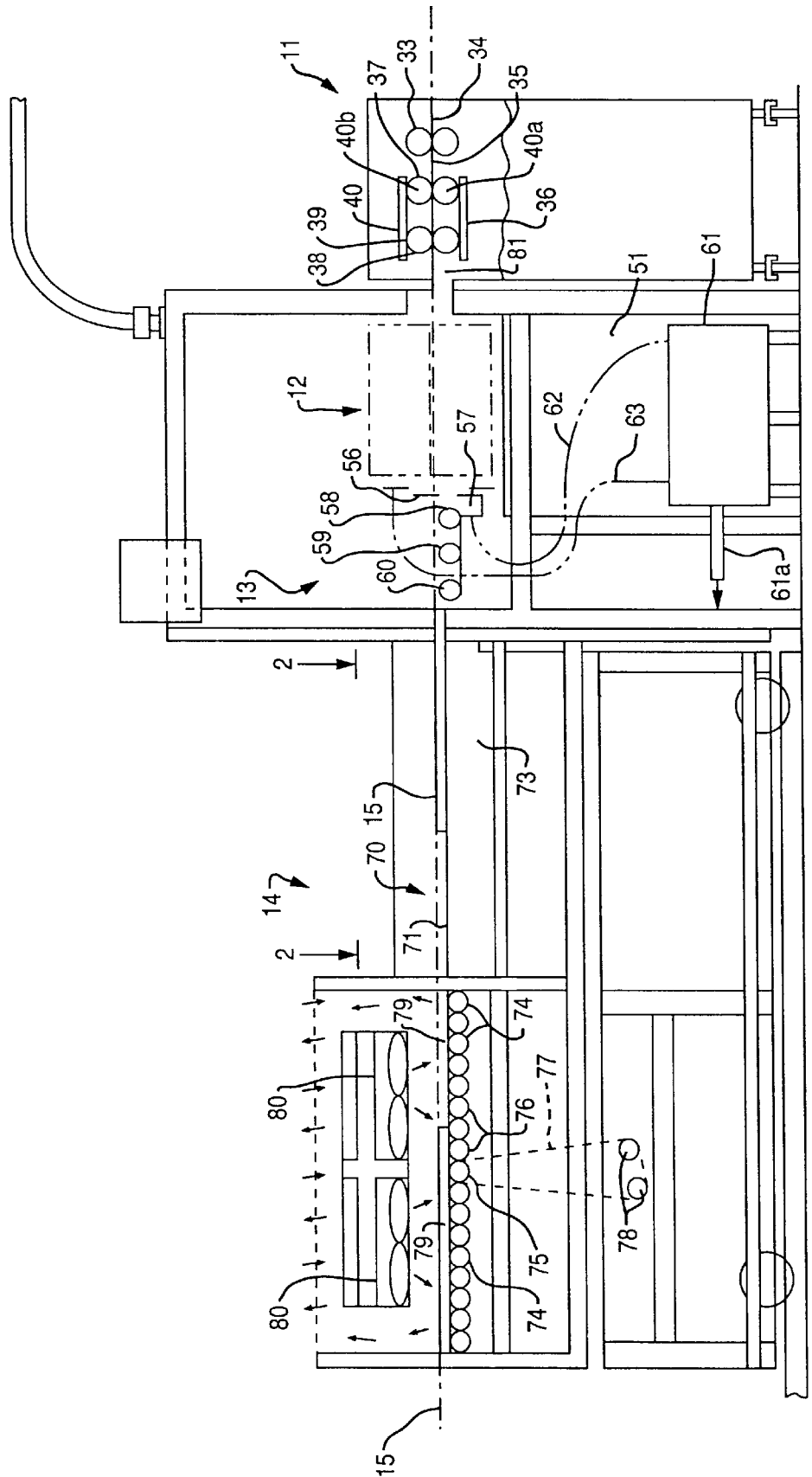
FIGS. 1a and 1b combine to provide a front view, partially broken away, showing diagrammatically the entire soldering system of the present invention.
Figure 2:
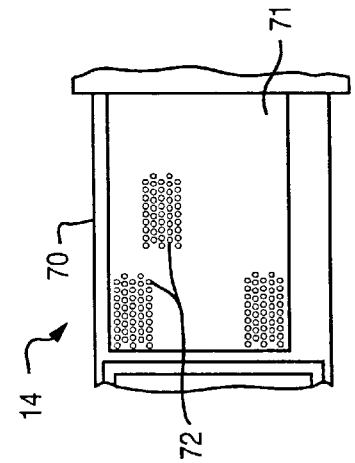
FIG. 2 is a top plan view, of the cooling station of the present invention.
Figure 1B:
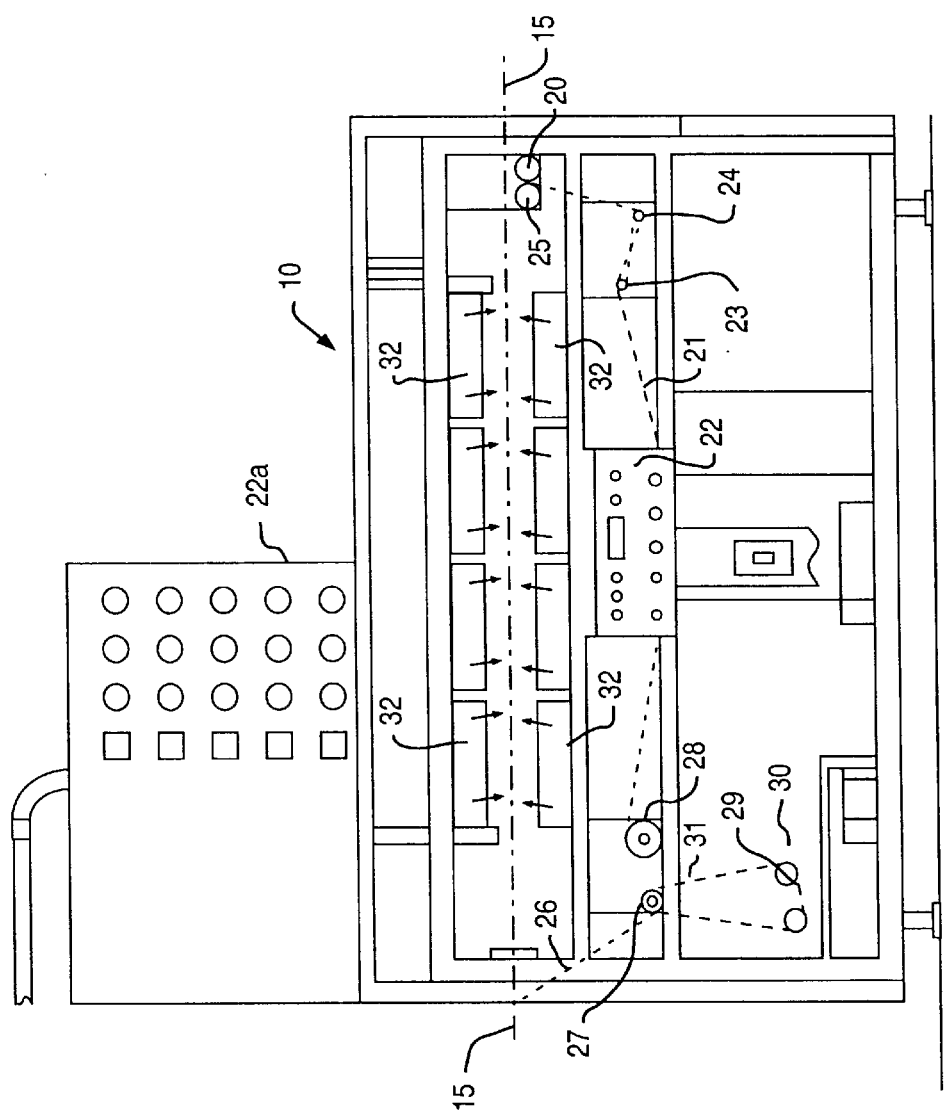

Referring to the invention in greater detail with reference to FIGS. 1 and 2 which together show the soldering system, a preheater 10, a fluxer 11, an improved solder station 12, a solder leveling station 13 and a cooling station 14 are arranged to receive and process printed circuit panels 15.

The preheater 10 includes input rollers 20 which, when printed circuit boards 15 are fed thereto, transport them to a suitable open conveyor belt 21, for example, a stainless steel wire belt to enable exposure of the lower panel surfaces, as well as their upper surfaces, to infrared radiation. The conveyor is driven along a path including guide rolls 23, 24, 25, 26, and 28. Suitably driven rollers 29 and 30 are connected by one or more belts 31 to drive the input rollers 20. Modules 22 and 22a include various control switches and indicators for the system.

Diagrammatically shown infrared heating elements 32 are located above and below the conveyor 21 to preheat the printed circuit boards 15 as they pass through the preheater 10. In an exemplary embodiment of the system, the printed circuit boards 15 are conveyed through the preheater 10 at speeds on the order of 6 inches per second, and exit from the preheat roller 26A at a surface temperature on the order of 250 degrees to 300 degrees F.

The printed circuit boards 15 enter the fluxer 11 at entry rollers 33 for conveying the heated printed circuit boards along plates 34, 35 and 36 through pairs of fluxing rollers 37 and 38 having soft fibrous and absorbent surfaces. As diagrammatically shown, a suitable soldering flux 39, described hereinafter, is supplied in appropriate quantities to rollers 37 and 38 to coat the printed circuit boards 15 as they pass through the fluxer. For example, an appropriate pump provided in the fluxer, which holds a quantity of flux in a container, pumps the flux through suitable piping to a distribution manifold 40 diagrammatically shown above the rollers 37 and 38 for spilling the flux onto the rollers 37 and 38 for transfer to the heated printed circuit boards 15. A container 40a below the rollers 37 and 38 is filled with flux via an outlet 40b, located at one end of the rollers, from the manifold 40. The container 40a also receives flux from the manifold 40 flow to the rollers. Thus, the coating rollers 37 and 38 receive the flux from both the manifold 40 and the container 40a.

The soldering station 12, shown in FIG. 1, and in more detail in FIGS. 3–6, includes suitable driven pairs of rollers 134a, 134b to receive the printed circuit boards 15 from the fluxer 11 and convey the printed circuit boards 15 through the soldering station and out through rollers 136a, 136b.

The printed circuit boards are then conveyed to the solder leveling station 13 which includes upper and lower air knives 56 and 57 tapered rollers 58, 59 and 60 suitably coupled to drive means, as diagrammatically shown in FIG. 2. Air heater 61 is supplied from an external air supply hose 61a to furnish compressed air through diagrammatically shown air lines 62 and 63 to the upper and lower air knives 56 and 57, respectively. Holes through the printed circuit boards are effectively cleared of solder by the air knives, and excess solder is stripped from the surface and the solder leveled on the conductive portions of the printed circuit boards 15. Solder removed from the printed circuit boards 15 returns to the solder sump through the solder skim section and return flow.

Solder leveler conveying rollers 58, 59 and 60 preferably are double tapered from their outer edges to a smaller diameter at their center lines, so that the printed circuit boards 15, which have just been soldered and leveled, are engaged at their edges by the tapered rollers, hence the still liquid solder is not disturbed and tracked.

The printed circuit boards 15 are conveyed by the tapered rollers to the cooler 14 which includes an air table 70 slightly tilted so that its input is above its output. For example, with a 36-inch long table, the input end can be 0.5 inches higher than the output to convey the panels at a desired speed. Perforations (not shown) provided over the entire surface 71 of the table 70, supply cooled air to the printed circuit boards 15 from a suitable air pump (not shown) supplying pressurized air to an air manifold 73 under the perforated surface 71. The printed circuit boards 15 delivered to the cooler 14 float on an air cushion above the table and are cooled at they are conveyed across the table. The integrity of the molten solder on the panel conductors is not impaired by contact with any conveying device until the solder has been solidified.

As the printed circuit boards 15 float from the air table 70, they are conveyed by suitable tapered rollers 74 similar in configuration to the rollers 58–60. The rollers 74 are driven at their ends by a drive gear 75, which engages driven gears 76 between the tapered conveyor rollers 74. Suitable belts 77 driven by pulleys or gears 78 rotate the drive gear 75 at a desired speed. Guide plates 79 are also provided between the rollers 74 to facilitate conveyance of the soldered printed circuit boards 15. Diagrammatically shown cooling fans 80 flow air downwardly onto the upper surface of the printed circuit boards 15 to cool the upper soldered surfaces. The cooled and soldered printed circuit boards 15 are then conveyed out the cooler 14 as finished soldered printed circuits.

Details of the improved circuit panel solder coating station are shown in FIGS. 3 through 6.

Figure 3:
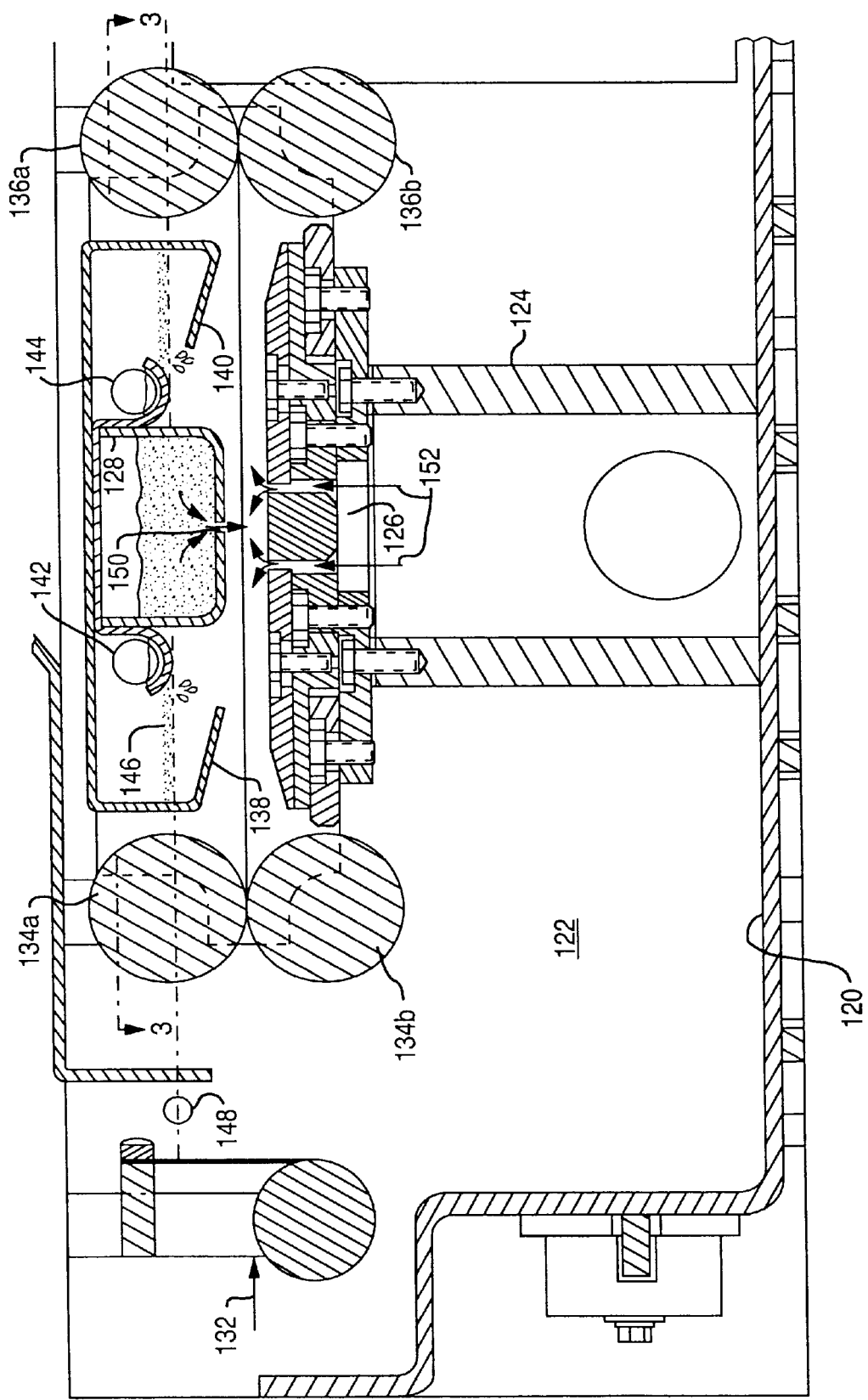
FIG. 3 is a side elevational view, in cross section, of an improved solder immersion station of the present invention.
Figure 4:
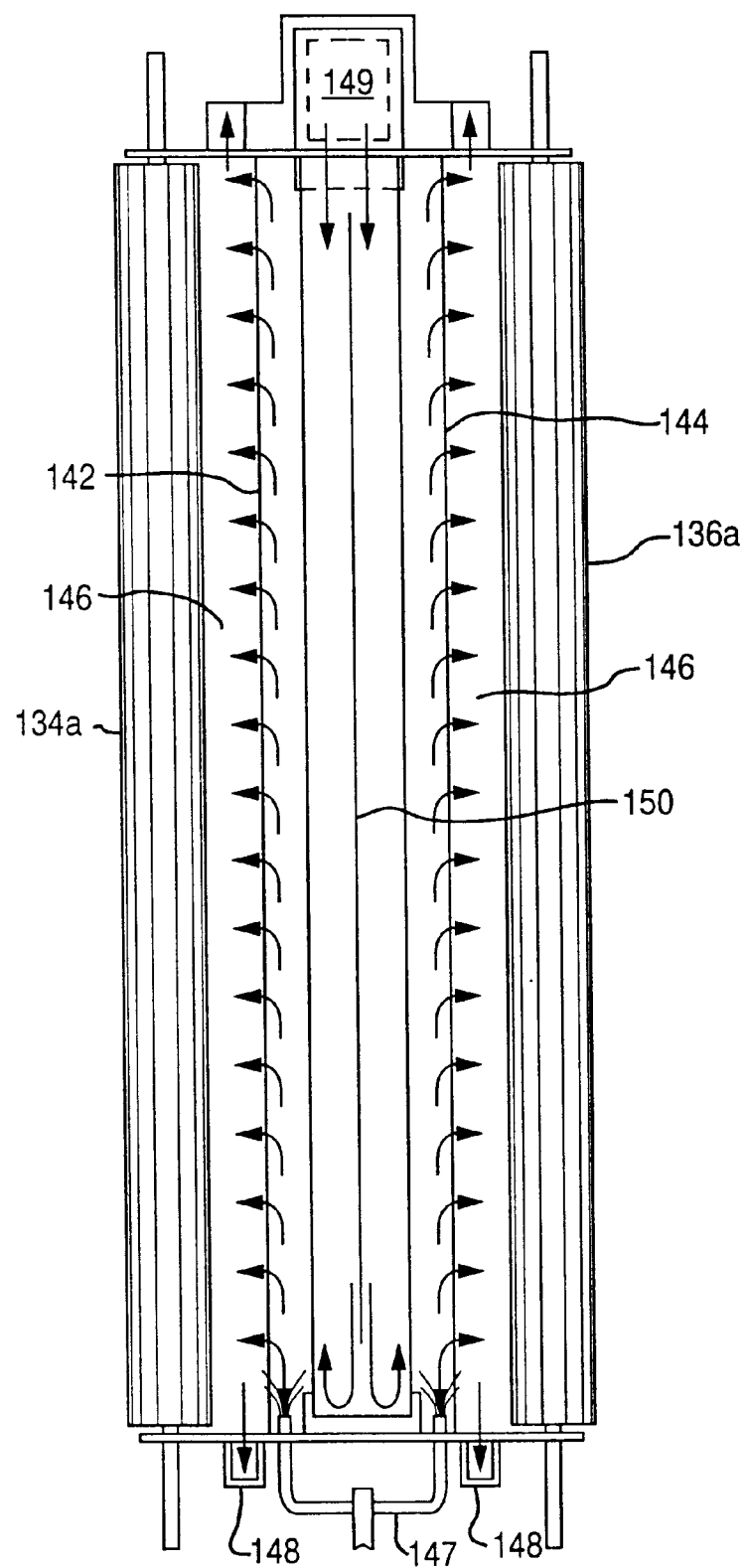
FIG. 4 is a cross-sectional view of the solder immersion station of FIG. 3, taken along section 3—3.

Referring to FIGS. 3 and 4, the improved solder coating station 12 comprises a solder sump 120 for containing a supply of molten solder 122. A solder manifold illustrated generally at 124 is supported within sump 120, and comprises upper and lower solder dispensing chambers 126 and 128, respectively, from which solder is directed onto the top and bottom surfaces of a printed circuit board 15 as it is conveyed through the soldering station 12, as will be described in detail hereinafter, which printed circuit board is passed therebetween in the direction of travel as indicated by arrow 132. Paired rollers 134a/134b and 136a/136b are located at either end of manifold 124 and are driven, in known manner by drive means (not shown) to convey printed circuit boards 15 through the manifold. Paired rollers 134a/134b and 136a/136b also serve to retain molten solder within the soldering station manifold so that the printed circuit boards 15 passing through the soldering station are completely immersed in molten solder. Guide plates 138 and 140 are provided between rollers 134/134b and 136a/136b to facilitate conveyance of the printed circuit boards 15 through the system, and prevent the boards from rising to the surface of the solder.

A feature and advantage of the present invention is to flood the surface of the solder in the solder coating station with a blanket of oil, i.e. to protect the solder from oxidation, and thus prevent or minimize dross formation. To this end, a pair of oil weirs 142, 144 are provided for continually flowing a thin blanket of oil 146 introduced via branched conduit 147 to cover the top surface of the molten solder 122 in solder coating station 12. Excess oil is continuously skimmed off the top surface of the solder by skimmers 148, where it is separated from the solder, collected, and then pumped back to coat the solder surface via branched conduit 147 and into oil weirs 142 and 144, by a suitable pump (not shown).

Upper solder dispensing chamber 126 includes a solder inlet 149 from which molten solder is introduced into the upper chamber 126, and one or more outlets 150 from which solder is flowed downwardly onto the top of a printed circuit board 15 passing thereunder. Lower chamber 128 comprises one or more outlets 152 from which solder is pumped, under pressure, onto the bottom side of a printed circuit board 15 passing over the outlets. Completing the solder coating station of the present invention is a pump (not shown) for withdrawing molten solder from sump 120, and for pumping a portion of the solder into both the upper and lower solder dispensing chambers 126 and 128.

Figure 5:
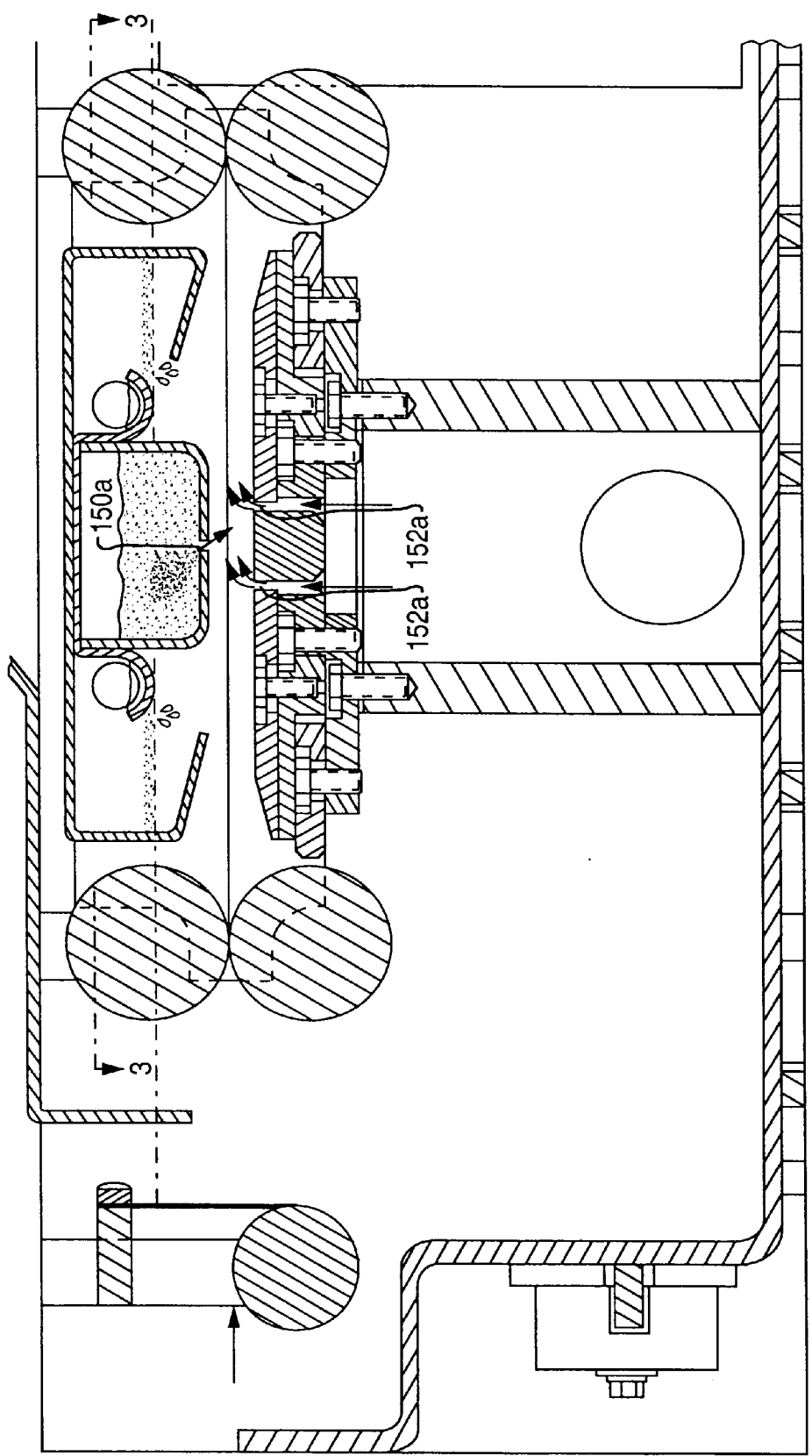
FIG. 5 is a view similar to FIG. 3, and showing the solder immersion station adapted to direct solder flow in the direction of travel of the printed circuit board through the solder immersion station.
Figure 6:
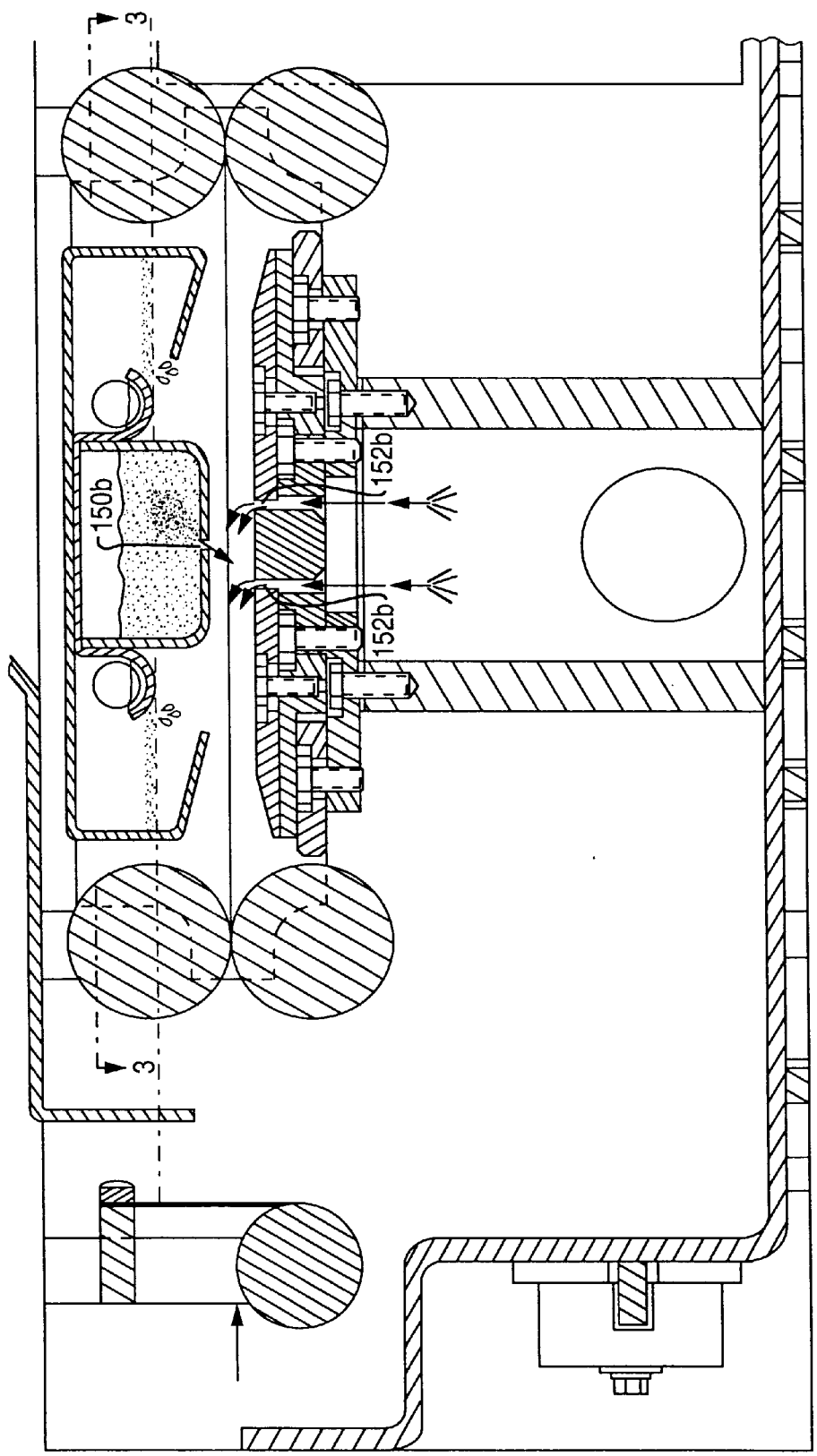
FIG. 6 is a view similar to FIG. 3, and showing the solder immersion station adapted to direct solder flow opposite the direction of travel of the printed circuit board through the solder immersion station.

Referring to FIG. 5, there is shown an alternative embodiment of solder coating station 12, wherein upper outlet 150A is oriented so as to direct the flow of solder in the direction of printed circuit board 15 travel. Similarly, lower outlets 152A are shaped so as to direct the flow of molten solder in the direction of printed circuit board 15 travel. Alternatively, as shown in FIG. 6, upper and lower outlets 150B and 152B, respectively, are oriented so as to direct the flow of solder against the direction of travel of the printed circuit board 15.

As will be appreciated, the solder coating station 12 made in accordance with the present invention essentially completely isolates the molten solder from contact with air. Accordingly, dross formation, i.e. from oxidation of the solder, is essentially entirely eliminated. This results in reduced solder consumption, and equipment maintenance problems as well as providing high quality solder coating. Moreover, the solder coating station made in accordance with the present invention may readily be adopted to direct solder flow perpendicular to, against or with the direction of travel the printed circuit board through the solder coating station, to best meet board configuration, requirements, flux displacement requirements, and other soldering criteria.

While the invention has been described in connection with specific embodiments, it will be understood that modifications may be made to the described invention, and that the invention is defined by the appended claims.

I claim:

1. In an apparatus for soldering printed circuit boards comprising a plurality of stations through which the printed circuit boards are conveyed in line, through a horizontal path, the stations including a preheat station having heating means and means for conveying the panels through the preheat station to elevate the temperature of the panels, a flux station for coating the panels with a flux and including means for conveying the panels through the flux station, a soldering station including at least one solder immersion chamber through which said printed circuit board panels may be horizontally conveyed for coating the printed circuit boards with molten solder, the improvement wherein the solder immersion chamber comprises a solder manifold having upper and lower solder chambers from which submerged streams of solder are directed onto the top and bottom surfaces, respectively, of printed circuit boards conveyed in a substantially horizontal path therebetween, said solder immersion chamber further comprising a pair of driven rollers at either end thereof for conveying the printed circuit boards through the solder immersion chamber and for damming and holding the molten solder within the solder immersion chamber, means in the upper solder chamber for flowing oil to cover the top surface of the molten solder in the solder immersion chamber, and, means for skimming oil from said top surface and for returning the skimmed oil to said means for flowing oil.

2. In an apparatus as defined in claim 1, the improvement wherein said manifold is located midway between said two pairs of rollers.

3. In an apparatus as defined in claim 1, the improvement which further includes a solder leveling station adjacent the exit of the solder immersion chamber including upper and lower fluid knives to level the molten solder and any open holes in the printed circuit boards by removing any excess solder thereon.

4. In an apparatus as defined in claim 1, the improvement which further includes a cooling station for cooling the soldered panels following leveling.

5. In an apparatus as defined in claim 4, the improvement wherein the cooling station comprises an air transport table including a perforated surface, and means for flowing cooling air through the perforations to convey and support the panel on a cushion of air thereby cooling the printed circuit board.

6. In an apparatus as defined in claim 3, the improvement wherein the solder leveling station comprises upper and lower air knives for blowing any excess solder from the printed circuit boards into the soldering station where it may be recycled for subsequent use in the soldering system.

7. In an apparatus as defined in claim 1, the improvement wherein said upper solder chamber comprises at least one outlet from which molten solder is flowed onto the top side of the printed circuit board.

8. In an apparatus according to claim 1, the improvement wherein solder is flowed from said upper and lower chambers onto said printed circuit board perpendicular to the direction of travel of said printed circuit board.

9. In an apparatus according to claim 1, the improvement wherein solder is flowed from said upper and lower chambers onto said printed circuit board in the direction of travel of said printed circuit board.

10. In an apparatus according to claim 1, the improvement wherein solder is flowed from said upper and lower chambers onto said printed circuit board opposite the direction of travel of said printed circuit board.

11. In an apparatus according to claim 1, the improvement wherein the means for flowing oil comprises a pair of oil weirs provided adjacent either side of the upper solder chamber.

12. A solder immersion chamber for simultaneously mass soldering both sides of a printed circuit board, comprising a solder manifold having upper and lower solder chambers from which submerged streams of solder are directed onto the top and bottom surfaces, respectively, of printed circuit boards conveyed in a substantially horizontal path therebetween, said solder immersion chamber further comprising a pair of driven rollers at either end thereof for conveying the printed circuit boards through the solder immersion chamber and for damming and holding the molten solder within the solder immersion chamber, means in the upper solder chamber for flowing oil to flood the top surface of the molten solder in the solder immersion chamber, and means for skimming oil from said top surface and for returning the skimmed oil to said means for flowing oil.

13. A solder immersion chamber as defined in claim 12, wherein said manifold is located midway between said two pairs of rollers.

14. A solder immersion chamber as defined in claim 12, wherein said upper solder chamber comprises at least one outlet from which molten solder is flowed onto the top side of the printed circuit board.

15. A solder immersion chamber according to claim 12, wherein solder is flowed from said upper and lower chambers onto said printed circuit board perpendicular to the direction of travel of said printed circuit board.

16. A solder immersion chamber according to claim 12, wherein solder is flowed from said upper and lower chambers onto said printed circuit board in the direction of travel of said printed circuit board.

17. A solder immersion chamber according to claim 12, wherein solder is flowed from said upper and lower chambers onto said printed circuit board opposite the direction of travel of said printed circuit board.

18. A solder immersion chamber according to claim 12, wherein the means for flowing oil comprises a pair of oil weirs provided adjacent either side of the upper solder chamber.

\* \* \* \* \*